United States Patent [19]

Konishi et al.

[11] 4,216,487

[45] *Aug. 5, 1980

[54] BIDIRECTIONAL LIGHT-ACTIVATED THYRISTOR HAVING SUBSTRATE OPTICAL ISOLATION

[75] Inventors: Nobutake Konishi; Takeshi Yokota; Yoshitaka Sugawara; Tsutomu Yatsuo; Masahiro Okamura, all of Hitachi, Japan

[73] Assignee: Hitachi, Ltd., Tokyo, Japan

[*] Notice: The portion of the term of this patent subsequent to Aug. 29, 1995, has been disclaimed.

[21] Appl. No.: 879,758

[22] Filed: Feb. 21, 1978

Related U.S. Application Data

[63] Continuation-in-part of Ser. No. 730,183, Oct. 5, 1976, Pat. No. 4,110,781.

[30] Foreign Application Priority Data

Oct. 11, 1975 [JP] Japan ............................. 50-121859

[51] Int. Cl.² ............................................. H01L 29/747
[52] U.S. Cl. ....................................... 357/39; 357/30; 357/55; 357/64
[58] Field of Search ..................... 357/30, 38, 39, 55, 357/64

[56] References Cited

U.S. PATENT DOCUMENTS

| 4,016,593 | 4/1977 | Konishi et al. | 357/39 |
| 4,021,837 | 5/1977 | Hutson | 357/64 |
| 4,110,781 | 8/1978 | Konishi et al. | 357/39 |

*Primary Examiner*—Joseph E. Clawson, Jr.
*Attorney, Agent, or Firm*—Craig & Antonelli

[57] ABSTRACT

Disclosed is a bidirectional light-activated thyristor which comprises a first and a second thyristor portion arranged in inverse-parallel with each other with a predetermined positional relation, an isolation section for electrically isolating the first and second thyristor portions from each other, a first and a second main electrode for connecting the first and second thyristor portions with each other in inverse-parallel, and a first and a second photo-trigger means for triggering the first and second thyristor portions respectively, wherein the photo-trigger signal from the first photo-trigger means is prevented by the first thyristor portion from reaching the second thyristor portion and the photo-trigger signal from the second photo-trigger means is prevented by the second thyristor portion from reaching the first thyristor portion.

11 Claims, 17 Drawing Figures

BIDIRECTIONAL LIGHT-ACTIVATED THYRISTOR HAVING SUBSTRATE OPTICAL ISOLATION

CROSS-REFERENCE TO RELATED APPLICATION

This application is a continuation-in-part application of our copending application, Ser. No. 730,183 filed on Oct. 5, 1976 now U.S. Pat. No. 4,110,781.

BACKGROUND OF THE INVENTION

1. Field of the Invention

This invention relates to a bidirectional light-activated thyristor actuated by a couple of photo-trigger means for bidirectional switching operation.

2. Description of the Prior Art

A bidirectional thyristor for effecting a switching operation in two directions in response to a signal from a photo-trigger means generally has a semiconductor substrate consisting of five layers of alternately opposite conductivities. Of these five layers, a first layer is in contact with a second layer, the second layer with a third layer, the third layer with a fourth layer, and the fourth layer with a fifth layer. The first to fourth layers with the first layer as an end layer on one side of the substrate make up a first 4-layer region, while the second of fifth layers with the fifth layer as the other end layer on the other side of the substrate constitute a second 4-layer region. Such a bidirectional thyristor has a first main electrode in ohmic contact with the outermost first layer and the second layer which is an intermediate layer adjacent to the first layer, a second main electrode in ohmic contact with the outermost fifth layer and the fourth layer which is another intermediate layer in contact with the fifth layer, and means for applying trigger signals. When such a thyristor is supplied with a trigger signal, in such a condition that a voltage is applied between the first and second main electrodes with one main electrode higher in potential than the other, one of the 4-layer regions whose forward direction coincides with the direction from the one main electrode to the other begins to conduct. When a trigger signal is applied in such a condition that a reverse voltage is applied between the main electrodes with the other main electrode higher in potential than the one main electrode, by contrast, the other of the 4-layer regions whose forward direction coincides with the direction from the other main electrode to the one main electrode enters a conductive state, thus the thyristor performs bidirectional switching operations.

Such a bidirectional thyristor is electrically equivalent to a couple of reverse-blocking thyristors (hereinafter merely called the "thyristors") connected in inverse-parallel and has the following advantages over the latter: (1) Since it may be contained in a single package, the number of cooling fins is reduced to a half, making possible a compact device; (2) It is switchable in two directions in response to a trigger signal, thus offering a compact control device; and (3) No special wiring is needed for inverse-parallel connection. Because of these advantages, such bidirectional thyristors are steadily replacing thyristor couples connected in inverse-parallel in many fields of application. In spite of their advantages, practical application of such bidirectional thyristors poses problems as mentioned below.

A first problem of such bidirectional thyristors is erroneous firing in commutation. Since such a bidirectional thyristor has a semiconductor substrate which includes a couple of thyristor portions connected in inverse-parallel in proximity to each other, one of the two thyristor portions may be erroneously fired prior to the application of a trigger signal thereto by accumulated residual carriers in the other thyristor portion at the time of commutation when the other thyristor portion will change from a conductive to a non-conductive state and the one thyristor portion the opposite way. Such an erroneous firing is likely to occur when the circuit to which such a bidirectional thyristor is applied has a heavy load, or when a high voltage or a high frequency is involved. Therefore, such a bidirectional thyristor is not practically useful, or even if practically useful, will find very limited application, without solving the problem of the erroneous firing in commutation.

A second problem is how to attain a substantially equal gate sensitivity of the two thyristor portions. With the two thyristor portions integrated in inverse-parallel within a semiconductor substrate, the gate electrode is inevitably disposed in one side of the semiconductor substrate. One of the thyristor portions, the PN junction of which is located farther from the side of the substrate provided with the gate electrode, has a lower gate sensitivity than the other thyristor portion. In the event that there is a wide difference in gate sensitivity between the two thyristor portions of a bidirectional thyristor, it fails to switch bidirectionally in response to the same gate signal, or even if it so switches, it is of no practical use because of the great difference in their initial conduction area. If the same switching characteristics are to be obtained in both directions in the presence of a difference in gate sensitivity, either different gate signals must be used or the gate electrodes must be differently constructed. This is practically difficult. As a result, such a bidirectional thyristor cannot be used in place of two thyristors connected in inverse-parallel unless the gate sensitivity of the two thyristor portions is caused to be substantially equal.

Apart from the aforementioned problems which are common to such bidirectional thyristors in general, another problem of erroneous firing is posed when such a bidirectional thyristor is used in an inductive load circuit. A thyristor converter is utilized in the conventional control systems for controlling the speed of a DC motor requiring accurate control operation like the motor used as a drive unit for a rolling mill. Generally, in such a control system six thyristor unit devices are provided which are connected like a three-phase full-wave rectifier circuit, each thyristor unit device being composed of a couple of thyristors connected in inverse-parallel. By replacing each of the thyristor unit devices a bidirectional thyristor, the system as a whole as well as the control circuit is reduced in size and the wiring work is saved conveniently. In spite of this advantage, the replacing of the thyristor unit devices of the thyristor converter with bidirectional thyristors poses a problem specific to the inductive load circuit in addition to the erroneous firing in commutation and the unbalanced gate sensitivity. A DC motor is always accompanied by a counter electromotive force during the operation thereof, and for activating one of the thyristor portions of such a bidirectional thyristors, it is necessary to apply a gate signal during the period when the forward voltage applied to the one thyristor portion is higher than the counter electromotive force. When the DC motor changes its rotation from forward to reverse direction or the load thereon is reduced suddenly, the counter electromotive force increases compared with that during the normal operation and, in addition, the lead angle for phase control is required to be retarded for deceleration, so that the gate signal is applied with a forward voltage lower than the counter electromotive force being applied to the thyristor portion. In other words, the gate signal is applied under such a condition that the thyristor portion to be fired is reversely biased, while the other thyristor portion connected in inverse-parallel to the former is forward biased. In this case if the bidirectional thyristor is subjected to the switching operation in two directions in response to the same gate signal or in response to a couple of synchronized gate signals from the same control circuit, the thyristor portion connected in inverse-parallel to the thyristor portion to be fired is undesirably fired, thus leading to the short-circuiting of the load and the power supply. One method to avoid this situation consists in subjecting the bidirectional thyristor to a switching operation in a range where the counter electromotive force is lower than the source voltage. This method, however, greatly restricts the speed control of the DC motor, thus making the practical application thereof impossible.

In recent years, the electric trigger system for performing the switching operation of a thyristor or a bidirectional thyristor by supplying a gate current from the gate electrode has been gradually replaced by a photo-trigger system whereby the thyristor or the bidirectional thyristor is subjected to switching operation by photocurrent generated by radiation of light on a semiconductor substrate of the thyristor. A five-layer bidirectional thyristor of the photo-trigger or light-activated type is disclosed, for example, in the U.S. Pat. No. 3,422,323 entitled "Five-layer Light-Activiated Semiconductor Device Having Bevelled Side", and granted to P. J. Whoriskey on Jan. 14, 1969, and the U.S. Pat. No. 3,943,550 entitled "Light-Activated Semiconductor-Controlled Rectifier" and granted to Nobutake Konishi, et al., on Mar. 9, 1976. As compared with the electric trigger system, the photo-trigger system has the advantages that the easy insulation of the gate circuit from the main circuit simplifies the gate circuit construction and at the same time facilitates application to a high-voltage circuit, and that the absence of feedback from the main circuit to the gate circuit eliminates the erroneous firing which otherwise might occur due to the inductive action. The photo-trigger system, in spite of these advantages, has various problems yet to be solved as mentioned above, if it is to be applied to the bidirectional thyristor.

SUMMARY OF THE INVENTION

An object of the present invention is to provide an improved bidirectional light-activated thyristor which is adapted to be switched in both directions in response to photo-trigger signals.

Another object of the invention is to provide an improved bidirectional light-activated thyristor which is not erroneously fired at the time of commutation.

A further object of the invention is to provide an improved bidirectional light-activated thyristor with almost the same firing sensitivity in both directions.

A still further object of the invention is to provide an improved bidirectional light-activated thyristor applicable to an inductive load circuit.

In order to achieve these objects, the bidirectional light-activated thyristor according to the present invention is featured by first and second thyristor portions arranged in inverse-parallel in a predetermined positional relation, an isolating section for electrically separating the first and second thyristor portions from each other, first and second photo-trigger means for triggering the first and second thyristor portions respectively, and means for blocking a photo-trigger signal from the first trigger means to the second thyristor portion and from the second photo-trigger means to the first thyristor. Each of the first and second thyristor portions is made up of a semiconductor section including four layers of alternately different conductivities arranged in such a manner as to form three PN junctions between the respective adjacent layers. The two semiconductor sections are connected in inverse-parallel or in other words fixedly juxtaposed as thyristor portions in opposite polarities. The two semiconductor sections may be formed either in a single semiconductor substrate or from two different semiconductor substrates. What is important is to semiconductor sections. In the case where the two provide a section for electrically isolating the two semiconductor sections are formed from two different semiconductor substrates, the isolating section may be constituted by the space between the substrates. In the case where the two semiconductor sections are formed from a single semiconductor substrate, on the other hand, the isolating section is formed between the two semiconductor sections in such a manner as not to provide substantially any passage of thyristor current between the semiconductor sections on the one hand and to block the transfer of residual carriers in one thyristor to the other, as will be described more in detail later.

As each of the first and second photo-trigger means, a light-emitting solid element such as a light-emitting diode is preferably disposed in proximity to each of the semiconductor sections. Alternatively, windows are preferably bored in the package containing the bidirectional light-activated thyristor to allow light in from external light sources. As another alternative, light is radiated preferably by the use of a light-transmitting member such as fiberscope for each photo-trigger means.

In this case, it is important to establish an operative relation between the first photo-trigger means and the first semiconductor section and between the second photo-trigger means and the second semiconductor section so that a photo-trigger signal may not be applied from the first photo-trigger means to the second semiconductor section or from the second photo-trigger means to the first semiconductor section.

It is also important that an end of the central junction of each of the first and second semiconductor sections is exposed or located in proximity to the light-receiving surface thereof where a photo-trigger signal is applied from the associated one of the first and second photo-trigger means. Other features and advantages of the present invention will be made apparent by the detailed description taken below in conjunction with the accompanying drawings.

DESCRIPTION OF PREFERRED EMBODIMENTS

Figure 1:
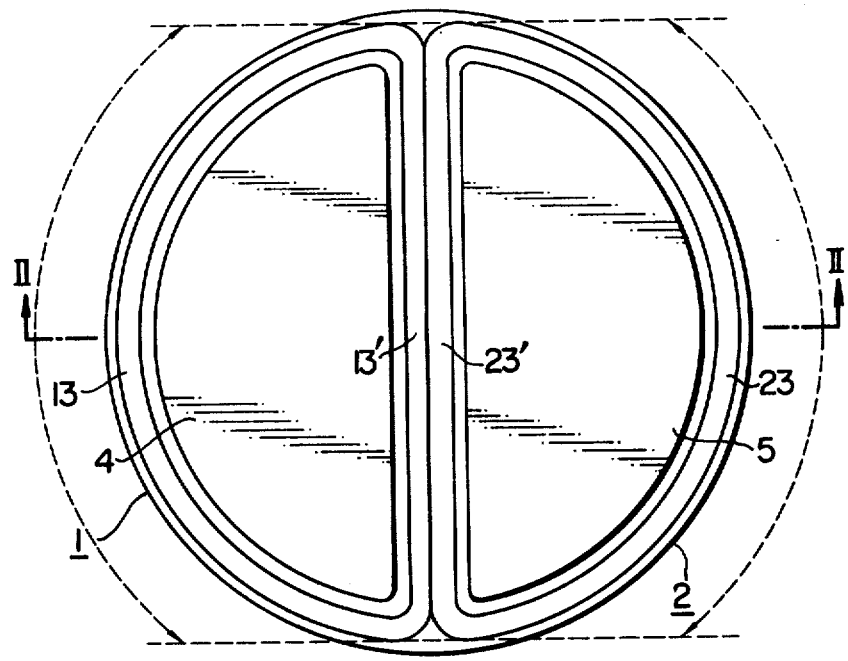
FIG. 1 is a plan view showing generally a first embodiment of the bidirectional light-activated thyristor according to the present invention.
Figure 2:
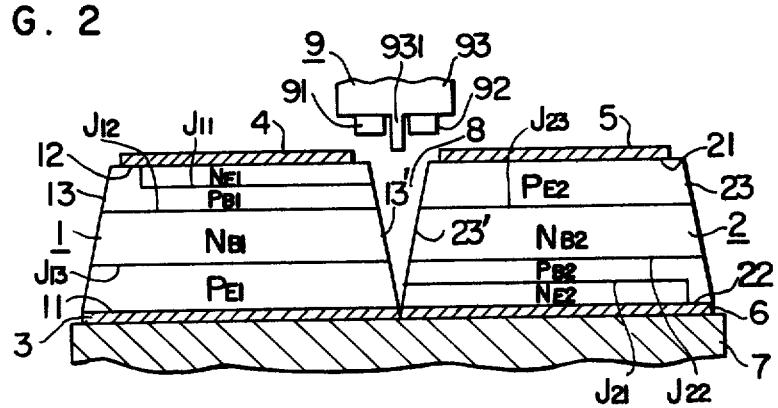
FIG. 2 is a sectional view taken in the line II—II of FIG. 1.

Referring to FIGS. 1 and 2 showing a first embodiment of the bidirectional light-activated thyristor according to the invention, reference numeral 1 shows a first semiconductor section including a couple of main surfaces 11 and 12 located on the opposite sides of the semiconductor section, side end surfaces 13 and 13' connecting the main surfaces with each other, and four contiguous layers $N_{E1}$, $P_{B1}$, $N_{B1}$ and $P_{E1}$ of alternately opposite conductivities which form a PN junction between each adjacent layers between the main surfaces. Numeral 2 shows a second semiconductor section including a couple of main surfaces 21 and 22 located on the opposite sides of the semiconductor section, side end surfaces 23 and 23' connecting the main surfaces 21 and 22 with each other, and four contiguous layers $N_{E2}$, $P_{B2}$, $N_{B2}$ and $P_{E2}$ of alternately opposite conductivities which form a PN junction between each adjacent layers between the main surfaces 21 and 22. $N_{E1}$ and $N_{E2}$ show emitter layers of N-type conductivity (hereinafter referred to as the $N_{E1}$ layer and $N_{E2}$ layer respectively), $P_{B1}$ and $P_{B2}$ base layers of P-type conductivity (hereinafter referred to as the $P_{B1}$ and $P_{B2}$ layers respectively) located adjacent to the $N_{E1}$ and $N_{E2}$ layers and forming first PN junctions $J_{11}$ and $J_{21}$ respectively with the $N_{E1}$ and $N_{E2}$ layers. $N_{B1}$ and $N_{B2}$ show base layers of N-type conductivity (hereinafter referred to as the $N_{B1}$ and $N_{B2}$ layers respectively) located adjacent to the $P_{B1}$ and $P_{B2}$ layers respectively and forming second PN junctions $J_{12}$ and $J_{22}$ with the $P_{B1}$ and $P_{B2}$ layers respectively. $P_{E1}$ and $P_{E2}$ show emitter layers of P-type conductivity (hereinafter referred to as the $P_{E1}$ and $P_{E2}$ layers respectively) located adjacent to the $N_{B1}$ and $N_{B2}$ layers and forming third PN junctions $J_{13}$ and $J_{23}$ with the $N_{B1}$ and $N_{B2}$ layers respectively. The $P_{E1}$ and $P_{E2}$ layers are exposed to the main surfaces 11 and 21 of the first semiconductor section 1 and the second semiconductor section 2 respectively, while the $N_{E1}$ and $P_{B1}$ layers and the $N_{E2}$ and $P_{B2}$ layers are exposed to the other main surfaces 12 and 22 respectively. The respective first PN junctions $J_{11}$ and $J_{21}$ have ends exposed to the main surfaces 12 and 22 and the side end surfaces 13' and 23' respectively in the groove 8, while the second PN junctions $J_{12}$ and $J_{22}$ and the third PN junctions $J_{13}$ and $J_{23}$ have ends exposed to the side end surfaces 13, 23; and 13', 23' respectively. The first semiconductor section 1 is so formed that the sectional area in a plane parallel to the main surfaces is progressively reduced from the main surface 11 toward the other main surface 12, while the second semiconductor section 2 is so constructed that the sectional area thereof in a plane parallel to the main surfaces is increased progressively from the main surface 21 toward the other main surface 22. Numerals 3 and 5 show first and second anode electrodes in low ohmic contact with the $P_{E1}$ and $P_{E2}$ layers at the main surfaces 11 and 21 respectively. Numerals 4 and 6 show first and second cathode electrodes in low ohmic contact with the $N_{E1}$ and $P_{B1}$ layers and the $N_{E2}$ and $P_{B2}$ layers respectively at the main surfaces 12 and 22. The first electrode 3 and the second cathode electrode 6 also function as adhesive layers for mounting the first and second semiconductor sections 1 and 2 in proximity to each other on an auxiliary support member of electrically conductive material 7. By mounting the first semiconductor section 1 and the second semiconductor section 2 in proximity to each other on the auxiliary support member 7, the groove 8 with V-shaped section is formed between the two semiconductor sections. Numeral 9 shows photo-trigger means provided with a couple of light sources such as light-emitting diodes 91 and 92 and a support member for supporting the same, which photo-trigger means is disposed opposedly to the groove 8 formed between the first and second semiconductor sections. The photo-trigger means 9 is supported on the support member 93 in such a manner that the light-emitting diode 91 is opposed to the side end surface 13' of the first semiconductor section 1 defining a part of the groove 8, while the light-emitting diode 92 is opposedly located to the side end surface 23' of the second semiconductor section 2 defining a part of the groove 8. The support member 93 includes a projected section 931 between the light-emitting diodes 91 and 92 to prevent a photo-trigger signal from being applied from the light-emitting diode 91 to the side end surface 23' of the second semiconductor section 2 and from the light-emitting diode 92 to the side end surface 13' of the first semiconductor section 1. The means for electrically connecting the first cathode electrode 4 to the second anode electrode 5, the passivation film for keeping stable the surfaces of the first and second semiconductor sections, and the package are not shown in the drawings. The operation of the bidirectional light-activated thyristor with this construction will be described below.

First assume that a voltage is applied to render the electrically-connected electrodes 4 and 5 negative in potential with respect to the electrically-connected electrodes 3 and 6. In the first semiconductor section 1, the first PN junction $J_{11}$ and the third PN junction $J_{13}$ are forward biased, while the second PN junction $J_{12}$ is reversely biased. In the second semiconductor section 2, by contrast, the first PN junction $J_{21}$ and the third PN junction $J_{23}$ are reversely biased while the second PN junction $J_{22}$ is forward biased. When a photo-trigger signal is applied to the groove 8 from the light-emitting diode 91 under this condition, the forwardly-blocked first semiconductor section 1 is fired. This firing mechanism will be described briefly below.

Radiation of light generates electron-hole pairs at and in the vicinity of the part of the second PN junction $J_{12}$ exposed to the groove 8. The electrons and holes are collected by the $N_{B1}$ and $P_{B1}$ layers respectively, thus deeply forward biasing the first PN junction $J_{11}$ which has thus far been slightly forward biased. When the voltage applied across the first PN junction $J_{11}$ at its end portion adjacent to the groove 8 exceeds the built-in potential of the first PN junction $J_{11}$, electrons begin to be injected at that portion from the $N_{E1}$ layer to the $P_{B1}$ layer. The electrons injected into the $P_{B1}$ layer are diffused into the $N_{B1}$ layer through the second PN junction $J_{12}$. These electrons cause the third PN junction $J_{13}$ so far slightly forward biased to be deeply forward biased, so that when the voltage applied to the PN junction $J_{13}$ exceeds the built-in potential of the third PN junction $J_{13}$, holes are injected from the $P_{E1}$ layer into the $N_{B1}$ layer. The holes thus injected are diffused into the $P_{B1}$ layer through the second PN junction $J_{12}$ thereby to forward bias the first PN junction $J_{11}$ more deeply. As a result, injection of electrons from the $N_{E1}$ layer is promoted. These processes of operation are repeated. When the current amplification factor $\alpha_{NPN}$ of the transistor consisting of the $N_{E1}$, $P_{B1}$ and $N_{B1}$ layers plus the current amplification factor $\alpha_{PNP}$ of the transistor consisting of the $P_{B1}$, $N_{B1}$ and $P_{E1}$ layers reaches unity (1), the first semiconductor section 1 having the function of a thyristor begins to conduct.

When a voltage is applied to render the electrically-connected electrodes 4 and 5 positive with respect to the electrically-connected electrodes 3 and 6, on the other hand, the same processes of operation as described above with reference to the first semiconductor section 1 are repeated in the forwardly-blocked second semiconductor section 2, thereby causing the same to conduct. The difference in this case is that light from the light-emitting diode 92 is used as a photo-trigger signal.

Figure 3:
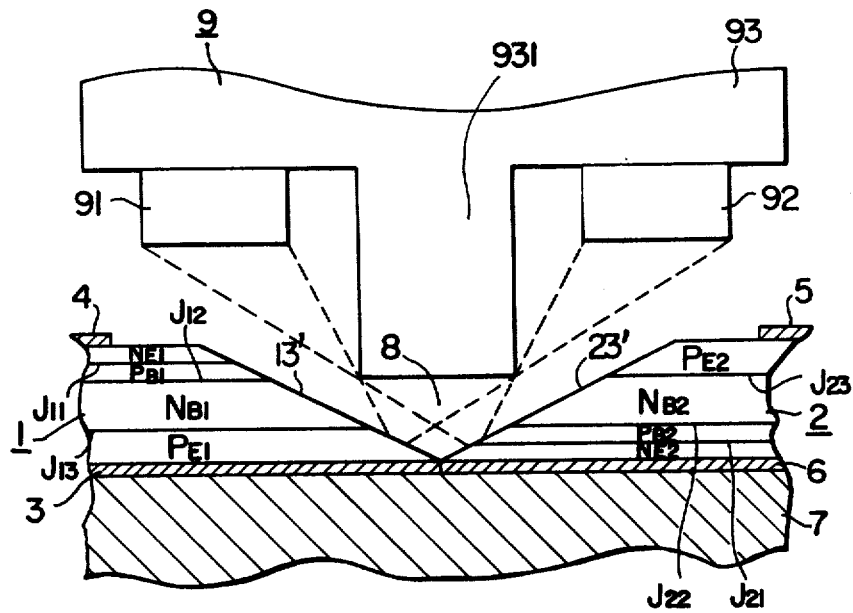
FIG. 3 is a partly enlarged view of FIG. 2.

In the bidirectional light-activated thyristor with the above-mentioned construction, the first semiconductor section 1 is isolated from the second semiconductor section 2 by the groove 8, and therefore the residual accumulated carriers in one of the semiconductor sections have no effect on the other semiconductor section for erroneous firing thereof, thus making it possible to improve the dv/dt immunity at the time of commutation. Further, since the comparatively sensitive ends of the second PN junctions $J_{12}$ and $J_{22}$ of the respective semiconductor sections are exposed to the sides of the groove 8 radiated with photo-trigger signals from the photo-trigger means 9, the firing sensitivity of the two semiconductor sections is rendered substantially equal, that is to say, a bidirectional light-activated thyristor with the same light-firing sensitivity in both directions is obtained. Furthermore, in view of the fact that the passage of the respective photo-trigger signals are blocked from the light-emitting diode 91 to the second semiconductor section 2 and from the light-emitting diode 92 to the first semiconductor section 1, a bidirectional light-activated thyristor applicable to an inductive load circuit is obtained, as explained below in detail with reference to FIG. 3.

In the case where a bidirectional thyristor is used in an inductive load circuit, it often happens that the semiconductor section to be fired is reversely biased due to the counter electromotive force caused to the inductive load while the semiconductor section required to offer a block is forwardly biased.

If the bidirectional light-activated thyristor shown in FIGS. 1 and 2 is used in an inductive load circuit, the respective photo-trigger signals radiated from the light-emitting diode 91 to the second semiconductor section 2 and from the light-emitting diode 92 to the first semiconductor section 1 are blocked by the projected section 931 formed between the light-emitting diodes 91 and 92, as shown by dashed lines in the drawing. Therefore, even if a photo-trigger signal is applied to the groove 8 from the light-emitting diode 91 with the first semiconductor section 1 in reverse-biased condition and the second semiconductor section 2 in forward-biased state, neither of the semiconductor sections is activated, thus preventing the short-circuiting of the load or the power supply.

Further advantages of the bidirectional light-activated thyristor of FIGS. 1 and 2 are that (1) since the second and third PN junctions maintaining the breakdown voltages of the semiconductor sections are exposed to the side end surfaces at a certain angle to the PN junctions, a high breakdown voltage is made possible as known well; (2) the radiation of photo-trigger signals on the side end surfaces permits an electrode to be formed over the whole of each main surface, thus improving the utilization factor of the semiconductor substrates on the one hand and making possible a compact device with a large capacity on the other; and (3) the use of two light-emitting diodes enables selection of the relative positions of the light-emitting diodes and the semiconductor sections with the best light sensitivity, thus reducing the size (output) of the light-emitting diodes compared with the case of a single light-emitting diode performing the switching operation in both directions.

Electric lamps may be used instead of the light-emitting diodes 91 and 92 of the photo-trigger means 9. In that case, light from each of the lamps making up light sources is preferably radiated on the associated light-receiving surface through a condensing lens which may be provided separately from the electric lamp bulb or alternatively incorporated in the bulb.

Figure 4:
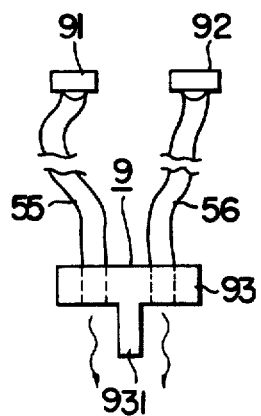
FIG. 4 a schematic diagram showing the photo-trigger means using light guides.

As shown in FIG. 4, light signals may be introduced from the light-emitting diodes or lamps 91 and 92 toward the support member 93 through light guides 55 and 56 like optical fiber.

Figure 5:
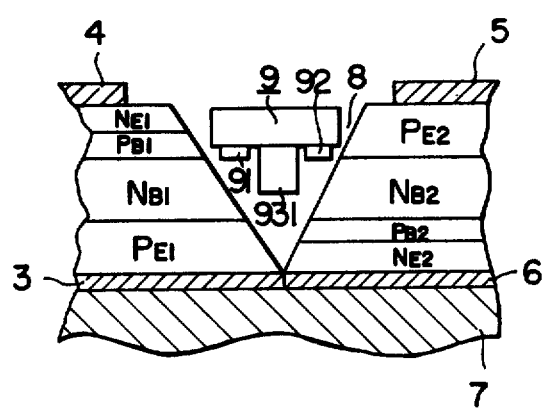
FIG. 5 is a sectional view of a modification of the embodiment shown in FIG. 2.

As shown in FIG. 5, the photo-trigger means 9 may be introduced into the groove 8. This reduces the size of the device while at the same time improving the sensitivity thereof. In this case, too, the light sources 91 and 92 may consist of light-emitting diodes or alternatively electric lamps. Further, light guides may be used to introduce light signals from the light sources to the support member 931.

Figure 6:
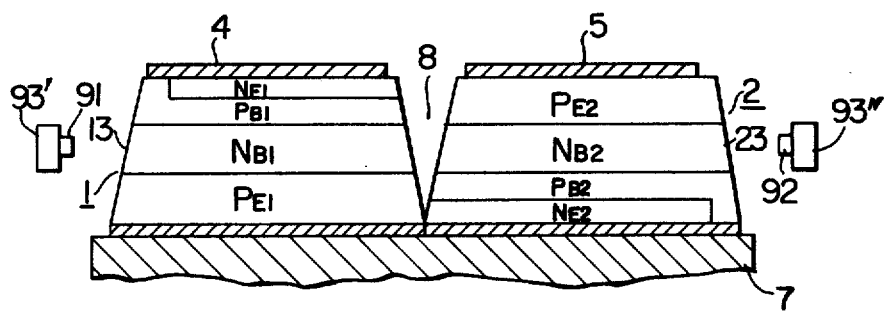
FIG. 6 is a sectional view of another modification of the embodiment shown in FIG. 2.

Furthermore, as shown in FIG. 6, light signals may be applied to the outer sides 13 and 23 of the semiconductor sections 1 and 2 respectively from light sources such as light-emitting diodes 91 and 92 disposed on opposite sides of the device. In more detail, the light-emitting diodes 91 and 92 face the outer sides 13 and 23 of the respective semiconductor sections 1 and 2 which are opposite to the groove 8 with respect to the respective semiconductor sections 1 and 2. Further, the light emitting diodes 91 and 92 are preferably located at the respective portions which come near from the respective main surfaces 12 and 21 of the semiconductor sections 1 and 2 toward the auxiliary support member 7. The outer sides 13 and 23 of the respective semiconductor sections 1 and 2 which are respectively opposite to the groove 8 and to which the respective light-emitting diodes 91 and 92 are faced are defined as the respective portions which have such a positional relation that the light from the light-emitting diode 91 is prevented by the semiconductor section 1 from being thrown onto the semiconductor section 2 and the light from the light-emitting diode 92 is prevented by the semiconductor section 2 from being thrown onto the semiconductor section 1. The regions of these positions are shown by broken lines in FIG. 1. The light-emitting diodes 91 and 92 may be replaced by electric lamps as in the foregoing modifications, and also light signals may be introduced almost to the outer sides by such light guide means as optical fiber. When light guide means are used the respective ends or light-emitting surfaces of the respective light guide means are disposed in the same manner as in the case where the light-emitting diodes 91 and 92 are utilized. Although the figure illustrates such a case where the light-emitting diodes 91 and 92 are disposed at the respective positions which come near from the respective main surfaces 12 and 21 of the semiconductor sections 1 and 2 toward the auxiliary support member 7, the respective light-emitting diodes 91 and 92 may be located at the positions which come far from the respective main surfaces 12 and 21 in the direction opposite to the auxiliary support member 7. In this case, the respective light-emitting surfaces of the light-emitting diodes 91 and 92 should be inclined such that the light-emitting diode 91 can irradiate only the outer surface 13 of the semiconductor section 1 and the light-emitting diode 92 can irradiate only the outer surface 23 of the semiconductor section 2. In this case, the light-emitting diodes or the lamps 91 and 92, as the case may be, can of course be supported on independent support members 93' and 93''. In this case, the semiconductor sections themselves function to block light signals associated therewith to the light-receiving surfaces of the semiconductor sections not associated therewith respectively. According to this embodiment, therefore, such a drawback that the light-emitting diodes 91 and 92 malfunction to actuate the semiconductor sections 2 and 1 respectively may be eliminated without using such additional parts for blocking light as shown in FIG. 2.

Figure 7:
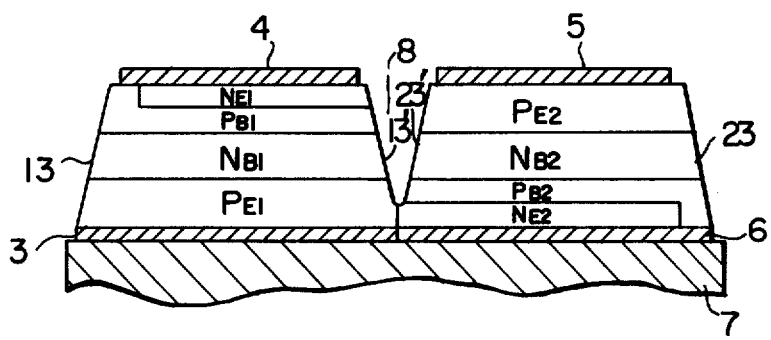
FIG. 7 is a sectional view of another embodiment of the invention.

Unlike the preceding embodiments with the semiconductor sections 1 and 2 completely separated by the groove 8 as shown in the drawings, the first semiconductor section 1 and the second semiconductor section 2 may be connected with each other by means of the bottom of the groove 8 in such a manner that photocurrent produced in one semiconductor section does not flow into the other semiconductor section to hamper the firing of the former, as shown in FIG. 7. This connection of the first semiconductor section 1 and the second semiconductor section 2 not only offers a handling convenience in production processes, contributing to mass production, but also results in the same characteristics for both semiconductor sections. This eliminates the characteristics variation between the two semiconductor sections which inevitably occurs in the case where the first and second semiconductor sections are formed in different substrates in the embodiments explained above with reference to FIGS. 1 to 6, while they may be formed from a single substrate. Even when the first and second semiconductor sections 1 and 2 are connected through the bottom of the groove 8 as shown in FIG. 7, the semiconductor sections are isolated substantially electrically by the groove 8, thereby achieving the object of the present invention with equal effect. The type of light sources, and the manner in which light signals are applied from the light sources to the light-receiving surfaces may be selected appropriately from among the methods described with reference to FIGS. 1 to 6.

Figure 8:
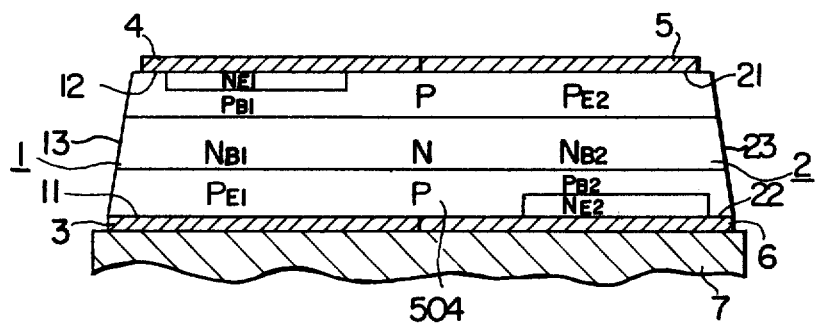
FIG. 8 is a sectional view of still another embodiment of the invention.

It is well known that the first and second semiconductor sections 1 and 2 formed in a single substrate are electrically isolated by sufficiently widening the PNP three-layer portion 504 connecting the first and second semiconductor sections as shown in FIG. 8 without forming the groove 8. Between the integrated main surfaces 11, 12 and similarly integrated main surfaces 12, 21, a semiconductor substrate with NPNPN contiguous five layers is formed. The two outermost N layers are formed in spaced relation in such a manner as to avoid superimposing one on the other when they are hypothetically projected on one of the opposite main surfaces. The first semiconductor section 1 is made up of one outermost N layer and that portion of the intermediate PNP three layers lying thereunder, while the second semiconductor section 2 is constituted by the other outermost N layer and the portion of the intermediate PNP three layers lying thereabove, with the isolating section 504 being formed by that portion of the intermediate PNP three layers which is positioned between the semiconductor sections 1 and 2, thus achieving the objects of the invention. In this case, photo-trigger signals are of course required to be radiated on the outer end surfaces 13 and 23 as already explained with reference to FIG. 6, and the semiconductor sections themselves act to block the passages of the respective light signals to the light-receiving surfaces of the opposite semiconductor sections respectively. By the way, the isolating section 504 may be diffused with heavy metal such as gold to improve the isolation characteristics on the one hand and to reduce the width thereof on the other.

Figure 9:
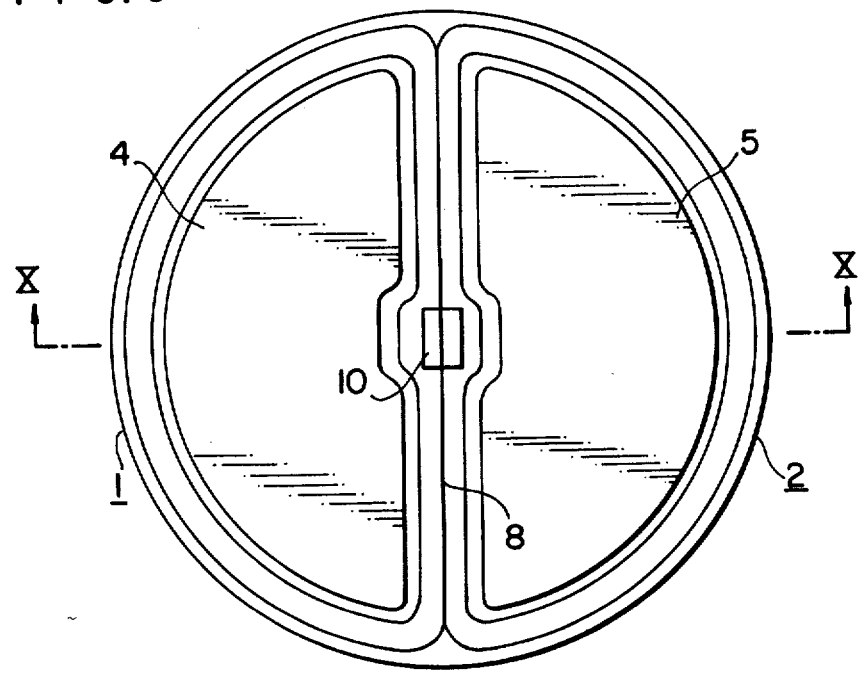
FIG. 9 is a plan view schematically showing a further embodiment of the invention.
Figure 10:
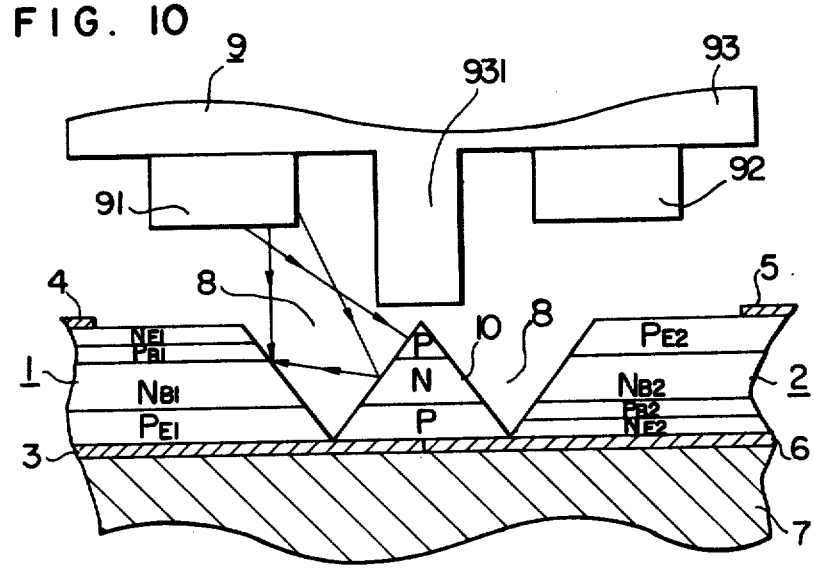
FIG. 10 is a partial sectional view taken in line X—X in FIG. 9.

Still another embodiment of the bidirectional light-activated thyristor according to the invention is shown in FIGS. 9 and 10. The feature of this embodiment lies in that the passage of the photo-trigger signals from the light-emitting diode 91 to the second semiconductor section 2 and from the light-emitting diode 92 to the first semiconductor section 1 is blocked more positively than in the embodiments shown in FIGS. 1 to 6. A semiconductor island member 10 with a triangular section is formed to occupy a part of the groove 8 between the first semiconductor section 1 and second semiconductor section 2, thereby producing a W-shaped part of the groove 8 with the member 10 opposed to the projected section 931. In the preceding embodiments shown in FIGS. 1 to 6, the light-blocking means can not prevent a light signal which is radiated on one semiconductor section and reflected therefrom from reaching the other semiconductor section, while it can prevent the light signal from being radiated directly. The configuration of the embodiment under consideration is improved in that even a photo-trigger signal reflected on the side end surface of one semiconductor section is prevented from being radiated on the side end surface of the other semiconductor section. Further, the photo-trigger signal is not limited to those components directly radiated on the light-receiving surface from the light source such as the light-emitting diode but the components reflected on the island member 10 is also radiated on the light-receiving surface, thus adding to the efficiency of trigger operation by effective use of light emitted from the light-emitting diode. For this purpose, preferably, the gradient of the reflection surface of the member 10 is carefully selected on the one hand and a reflective metal film is formed on the surface thereof on the other. The semiconductor structure of the member 10 in this embodiment is derived from the advantage of simultaneous formation of the first and second semiconductor sections and the member 10 by the W-shaped groove arrangement in a single semiconductor substrate. If this manufacturing advantage is discarded, a material other than semiconductor may be used for the island member 10. Also, the member 10 may assume any desired shape of the section thereof instead of triangle at the sacrifice of the advantage of reflection of a photo-trigger signal on the member 10. In the embodiment under consideration, the first and second semiconductor sections have the same structure as the embodiment shown in FIGS. 1 and 2. The length of the island member 10 along the groove 8 may be extended even over the entire length of the groove, depending on the type or condition of the light sources applied thereto.

Figure 11:
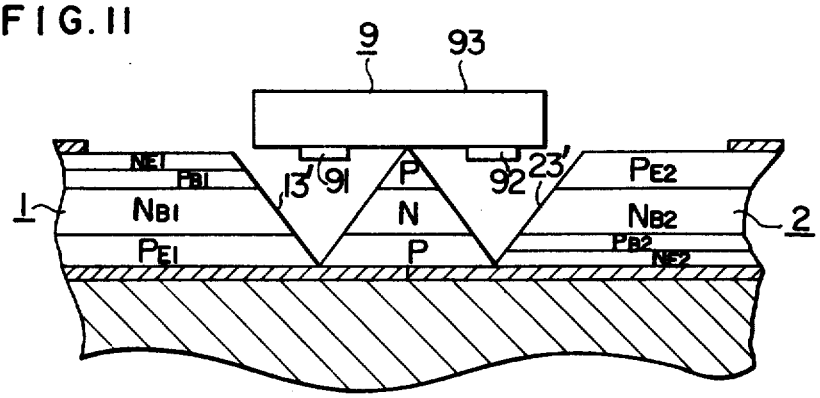
FIG. 11 is a partial sectional view showing a modification of the embodiment shown in FIG. 10.

As shown in FIG. 11, the light sources such as the light-emitting diodes 91 and 92 held by the support member 93 may be introduced into the two groove sections partitioned by the island member 10. In this case, it will easily be understood that the projected section 931 of the support member 93 as shown in FIG. 10 is not required.

The embodiment of FIGS. 9 to 11 may employ electric lamps instead of the light-emitting diodes as light sources. Further, light guides such as optical fibers may be used to guide light signals from the light-emitting diodes or other light sources such as electric lamps to the support member 93 or even into the groove 8, as in the embodiments of FIGS. 1 to 7.

Figure 12:
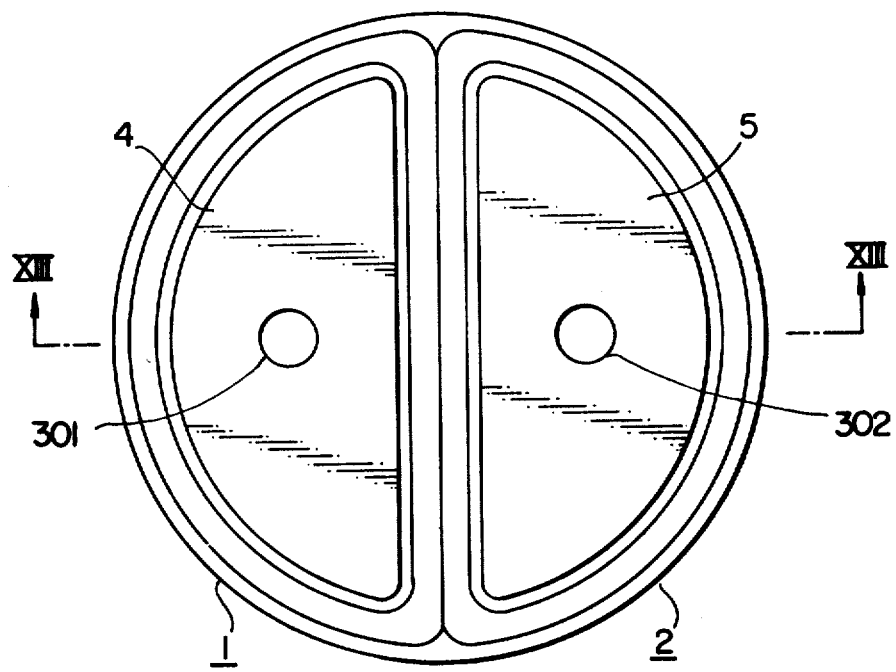
FIG. 12 is a plan view schematically showing still another embodiment of the present invention.
Figure 13:
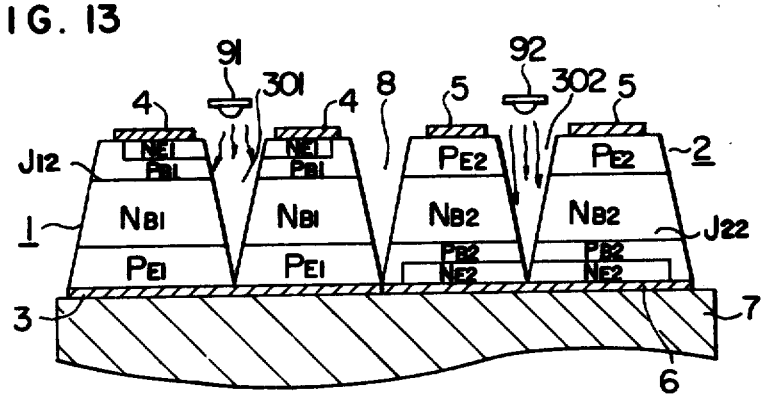
FIG. 13 is a sectional view taken in line XIII—XIII in the embodiment of FIG. 12.

A further embodiment of the bidirectional light-activated thyristor according to the invention is shown in FIGS. 12 and 13. The bidirectional light-activated thyristor according to this embodiment has the same advantages as the preceding embodiments in spite of the absence of the projected section 931 shown in FIGS. 2, 3, 4, 5 and 10. The feature of the construction of this embodiment is that a first aperture 301 is formed in the first semiconductor section 1 from the main surface 12 toward the main surface 11 while a second aperture 302 is bored in the second semiconductor section 2 from the main surface 21 toward the main surface 22, with the groove 8 separating the first and second semiconductor sections as explained with reference to FIGS. 1 and 2. The light-emitting diodes 91 and 92 or like light sources are disposed opposedly to the first aperture 301 and the second aperture 302 respectively. The spaced relation between the light-emitting diodes 91 and 92 eliminates, even in the absence of such a projected section 931 as illustrated in the first and second embodiments, the undesirable radiation of a photo-trigger signal from the light-emitting diode 91 to the second semiconductor section 2 or from the light-emitting diode 92 to the first semiconductor section 1, especially, the radiation of a strong photo-trigger signal causing the erroneous firing of undesired thyristor portion. Further, the light-emitting diodes 91 and 92 may be introduced into the respective aperture. In spite of the construction of the first and second apertures 301 and 302 through the respective semiconductor sections as shown in FIG. 13, the objects of the invention are achieved so far as they are formed in such a manner as to expose the second PN junctions. When taking the breakdown voltage into consideration, the walls of the first and second apertures are preferably formed at the same angle as the side end surfaces of the semiconductor sections with respect to the PN junctions.

In FIGS. 12 and 13, the groove 8 is provided as a means for electrically isolating the first and second semiconductor sections 1 and 2. As explained in detail with reference to the embodiment of FIG. 8, however, the objects of the invention are achieved with equal effect by connecting the first and second semiconductor sections alternatively the PNP part of the substrate. Like in the embodiment of FIG. 8, the PNP semiconductor section 504 acting as the isolating means may be diffused with such heavy metal as gold.

Figure 14:
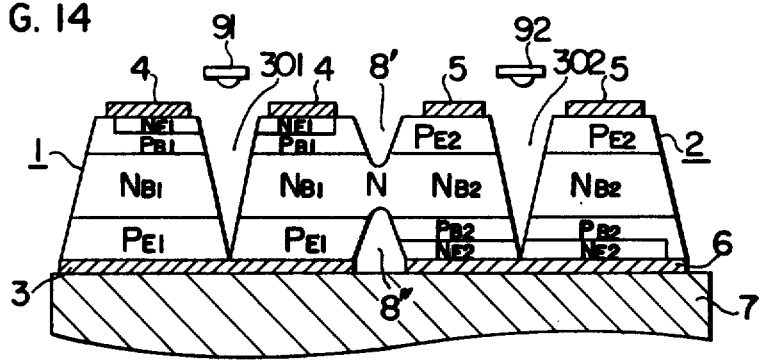
FIG. 14 is a sectional view of a still further embodiment of the invention.

The isolating section made of the PNP semiconductor section may be provided with slots 8' and 8" as shown in FIG. 14 while maintaining the $N_{B1}$ and $N_{B2}$ layers of the first and second semiconductor sections connected to each other, thus reducing the width of the isolating section 504.

As the light sources for the embodiment shown in FIGS. 12 to 14, electric lamps may be used in place of the light-emitting diodes 91 and 92 to apply a photo-trigger signal directly to the respective apertures 301 and 302. It will also be easily understood that the photo-trigger signal produced by the light-emitting diodes or electric lamps may be introduced toward the upper sides or into the apertures 301 and 302 by means of such light guides as optical fiber (not shown in the drawings).

Figure 15:
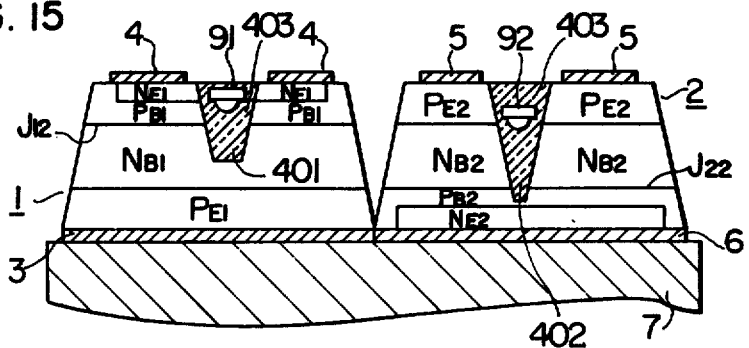
FIG. 15 is a sectional view of a further embodiment of the invention.

A still further embodiment of the invention is shown in FIG. 15. This embodiment is featured in that recesses 401 and 402 are formed in the first and second semiconductor sections 1 and 2 with openings at the respective main surfaces into which recesses the light-emitting diodes 91 and 92 are introduced and that a transparent insulating material 403 is filled in the recesses. The bottom portions of the respective recesses must reach at least the second PN junctions of the respective semiconductor sections 1 and 2. According to this embodiment, the photo-trigger signal from the light-emitting diode 91 or 92 is positively prevented from being radiated on the second or first semiconductor section 1 or 2 respectively. Further, the proximity of the light-emitting diodes to the exposed parts of the second PN junctions makes possible an improved photo-coupling for a reduced size of the light-emitting diodes.

In this embodiment also, the light-emitting diodes 91 and 92 may be replaced by electric lamps embeded in the recesses 401 and 402 respectively. Further, the photo-trigger signals from the light-emitting diodes or electric lamps, as the case may be, can be introduced into the recesses 401 and 402 by means of light guides such as optical fiber with ends thereof embeded in the recesses (not shown in the drawing). Furthermore, instead of the groove 8, the isolating section 504 made of a PNP section may be provided in the same manner as shown in FIG. 8. Also, this particular part may be diffused with such heavy metal as gold to reduce the width of the isolating section 504, for the same reasons mentioned with reference to the preceding embodiments. It will also be easily understood that the isolating section may be found with the slots 8' and 8" as shown in FIG. 14.

Figure 16:
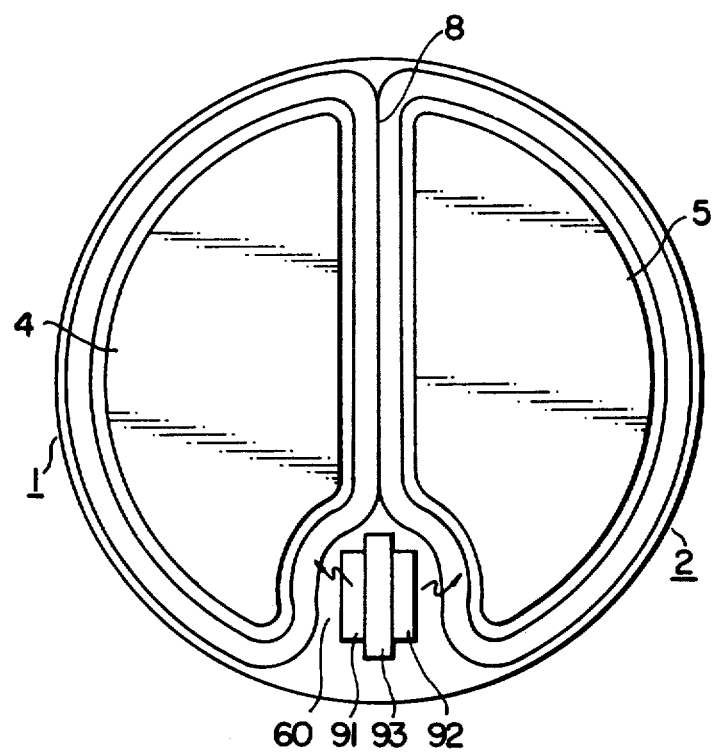
FIG. 16 is a plan view schematically showing an even further embodiment of the invention.

Still another embodiment of the bidirectional light-activated thyristor according to the invention is shown in FIG. 16. The feature of this embodiment resides in that the light-emitting diodes are disposed on one side of the semiconductor sections. A notch 60 is formed in part of the groove 8 between the first semiconductor section 1 and the second semiconductor section 2, so that the photo-trigger means 9 including the light-emitting diodes 91 and 92 or like light sources and the support member 93 therebetween is arranged in the notch 60. The light-emitting diode 91 is disposed on the first semiconductor section 1 side of the support member 93, and the light-emitting diode 92 on the semiconductor section 2 side thereof, thus enabling the support member 93 to prevent a photo-trigger signal produced by the light-emitting diodes 91 and 92 from being radiated on the second semiconductor section 2 and the first semiconductor section 1 respectively. This construction is advantageous in containing the device in a flat package. In place of the groove 8 provided in the embodiment of FIG. 16 for separating the first semiconductor section 1 and the second semiconductor section 2, such a PNP semiconductor section 504 may be formed as shown in FIG. 8 for the same purpose. In this case, the isolating section 504 is formed with the notch 60 shown in FIG. 16 with the photo-trigger means 9 located therein (not shown in the drawing). It will also be seen that the light-emitting diodes shown as the light sources may be replaced by electric lamps as in the preceding various embodiments. Further, light guides such as optical fiber may be utilized to guide light signals from such light sources as light-emitting diodes or electric lamps.

Figure 17:
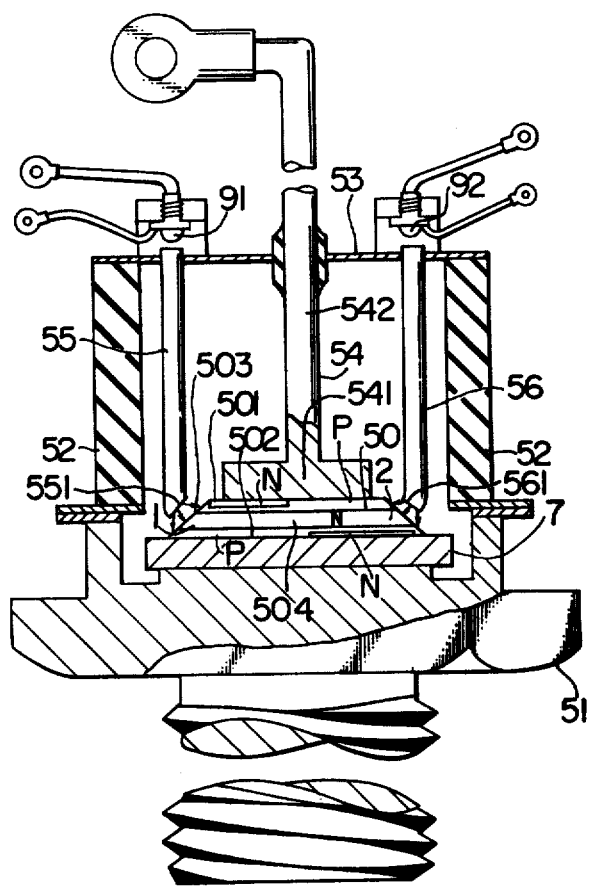
FIG. 17 is a sectional view schematically showing still another embodiment of the invention.

The diagram of FIG. 17 shows the whole structure of a light-activated thyristor with integrated first and second semiconductor sections, in which photo-trigger signals from such light sources as light-emitting diodes are introduced to the light-receiving surfaces by way of such light guide as optical fiber. In this drawing, numeral 50 shows a semiconductor substrate including a couple of main surfaces 501 and 502, side end surfaces 503 connecting the main surfaces to each other, and NPNPN five contiguous layers formed between the main surfaces. As already explained with reference to FIG. 8, the two outermost N layers of the substrate 50 must be located such that they are not superimposed when supposedly projected on one of the main surfaces and they are predeterminedly spaced from each other. Having such N layers, the first semiconductor section 1 and the second semiconductor section 2 are formed with the isolating section 504 therebetween. The semiconductor substrate 50 is mounted on a base 51 of electrically conductive material through an auxiliary support member 7 which is also made of an electrically conductive material. The semiconductor substrate is hermetically contained in a casing including the base 51, an insulating tube 52 and a cover plate 53. Numberal 54 shows one of the electrodes, and numerals 55 and 56 light guides such as optical fiber for optically coupling the light-emitting diodes 91 and 92 to the side end surfaces 503 of the semiconductor substrate 50. The respective light-emitting ends 551 and 561 of the light guides 55 and 56 are faced to the respective portions on the side end surface 503 at which the intermediate PN junctions of the semiconductor sections 1 and 2 are exposed respectively and which are opposite to each other with respect to the isolating region 504, in other words which portions can not be reached by the light rays from the light guides 56 and 55 respectively by being blocked by the semiconductor sections 2 and 1 respectively. Further, the light guides 55 and 56 are arranged such that the light-emitting ends 551 and 561 thereof are placed at the respective positions which come near toward the auxiliary support member 7 from one of the two plane surfaces, to which the lead-out portion 542 is connected, of the plane portion 541 of the one electrode 54.

By adopting this construction, the fact that the isolating section 504 is formed between the first semiconductor section 1 and the second semiconductor section 2 prevents the accumulated residual carriers in one semiconductor section from having an effect on the other, thus eliminating the erroneous firing at the time of commutation. Also, since the arrangement is made such that the photo-trigger signals from the light-emitting diodes 91 and 92 are respectively thrown, through the light guides 55 and 56, onto the respective most photosensitive portions on the side end surface 503 at which the intermediate PN junctions of the respective semiconductor sections 1 and 2 are exposed and that the photo-trigger signal from the light-emitting diode 91 is prevented from reaching the semiconductor section 2 by the semiconductor section 1 and the plate portion 541 of the one electrode 54 and the photo-trigger signal from the light-emitting diode 92 is prevented from reaching the semiconductor section 1 by the semiconductor section 2 and the same plate portion 541, light sensitivity in both directions can be maintained substantially identical on the one hand and the light-emitting diode 91 or 92 is prevented from erroneously firing the first semiconductor section 1 or the second semiconductor section 2 respectively. Another advantage of this construction is the ease with which the light-emitting diodes are replaced. The shape of the casing has no relation with the features of the embodiment under consideration, and offers only an example for explaining the arrangement of the light-emitting diodes outside of the casing.

It will be easily seen that the isolating section 504 in the embodiment of FIG. 17 may be replaced with equal effect by the groove 8 as shown in FIGS. 1 to 7 for constructing the light-activated thyristor shown in FIG. 17.

It is already described that instead of the light-emitting diodes of FIG. 17, electric lamps may be used.

The advantages of the present invention will be explained below in terms of figures, with reference to the construction as shown in FIGS. 1 and 2.

The first and second semiconductor sections were formed by halving a silicon wafer disc 16 mm in diameter and 350$\mu$ thick by means of a groove with a V-shaped section which is 2.2 mm wide at its top. The voltage rating and current rating involved were 800 V and 100 A respectively. As the two light emitting diodes, GaAs light-emitting elements of 0.1 W (photo output of 10 mW) was employed. At the rise rate of 100 A/$\mu$s of reverse current, the dv/dt immunity was 100 V/$\mu$s, while it was ascertained that neither of the semiconductor sections is activated in response to a photo-trigger signal applied to one semiconductor section with the other semiconductor section forward-biased at 800 V.

We claim:

1. A bidirectional light-activated thyristor comprising:

a semiconductor substrate having a pair of oppositely-positioned main surfaces and a side surface interconnecting said pair of main surfaces, said semiconductor substrate including a first semiconductor section, a second semiconductor section, and an isolating section disposed between said first and second semiconductor sections for electrically isolating said first semiconductor section and said second semiconductor section from each other, said first semiconductor section including four contiguous PNPN layers of alternately opposite conductivities arranged so as to form a PN junction between each adjacent ones of said layers, said each PN junction being substantially parallel to said main surfaces, one end P-type layer of said four layers being exposed at one of said pair of main surfaces and the other end N-type layer of said four layers being exposed at the other main surface, said second semiconductor section including four contiguous PNPN layers of alternately opposite conductivities arranged so as to form a PN junction between each adjacent ones of said layers, said each PN junction being substantially parallel to said main surfaces, one end P-type layer of said four layers being exposed at said other main surface and the other end N-type layer of said four layers being exposed at said one main surface, first electrode means disposed on said one main surface so as to be in ohmic contact with said one end P-type layer of said first semiconductor section and said other end N-type layer of said second semiconductor section, second electrode means disposed on said other main surface so as to be in ohmic contact with said other end N-type layer of said first semiconductor section and said one end P-type layer of said second semiconductor section, first optical trigger means for applying a light signal to said side surface of said first semiconductor section, so as to trigger said first semiconductor section, second optical trigger means for applying a light signal to said side surface of said second semiconductor section, so as to trigger said second semiconductor section, said semiconductor substrate forming means for blocking the passage of a light signal from said first optical trigger means to said second semiconductor section and the passage of a light signal from said second optical trigger means to said first semiconductor section.

2. A bidirectional light-activated thyristor according to claim 1, in which said first and second optical trigger means are disposed such that the respective light-emitting portions thereof are opposite to each other with respect to and adjacent to said isolating section on said side surface of said semiconductor substrate thereby forming said light signal blocking means.

3. A bidirectional light-activated thyristor according to claim 2, in which said isolating section is a PNP three-layer semiconductor section connecting said first and second semiconductor sections.

4. A bidirectional light-activated thyristor according to claim 3, in which light signals from said first and second trigger means are introduced through first and second light guides respectively to said light-receiving surfaces of said first and second semiconductor sections respectively.

5. A bidirectional light-activated thyristor according to claim 3, in which said PNP three-layer semiconductor section is diffused with a heavy metal.

6. A bidirectional light-activated thyristor according to claim 5, in which light signals from said first and second trigger means are introduced through first and second light guides respectively to said light-receiving surfaces of said first and second semiconductor sections respectively.

7. A bidirectional light-activated thyristor according to claim 3, in which said PNP three-layer semiconductor section includes a couple of opposite slots open at the respective outermost P layers, said slots having the bottoms thereof each reaching an N layer, said first and second semiconductor sections being connected by means of the N layer included in said PNP three-layer semiconductor section.

8. A bidirectional light-activated thyristor according to claim 3, in which each of said first and second trigger means is selected one of a light-emitting diode and an electric lamp.

9. A bidirectional light-activated thyristor according to claim 8, in which the light signals from said respective selected ones of a light-emitting diode and an electric lamp are introduced to the light-receiving surfaces of said first and second semiconductor sections by means of light guides respectively.

10. A bidirectional light-activated thyristor according to claim 2, in which said other main surface of said semiconductor substrate is fixed to a supporting member and the respective light-emitting portions of said first and second optical trigger means are disposed at positions from which supporting member is nearer than from said one main surface.

11. A bidirectional light-activated thyristor comprising:

a semiconductor substrate having a pair of oppositely-positioned main surfaces and a side surface interconnecting said pair of main surfaces, said semiconductor substrate including a first semiconductor section, a second semiconductor section, and an isolating section disposed between said first and second semiconductor sections for electrically isolating said first semiconductor section and said second semiconductor section from each other, said first semiconductor section including four contiguous PNPN layers of alternately opposite conductivities arranged so as to form a PN junction between each adjacent ones of said layers, said each PN junction being substantially parallel to said main surfaces, one end P-type layer of said four layers being exposed at one of said pair of main surfaces and the other end N-type layer of said four layers being exposed at the other main surface, said second semiconductor section including four contiguous PNPN layers of alternately opposite conductivities arranged so as to form a PN junction between each adjacent ones of said layers, said each PN junction being substantially parallel to said main surfaces, one end P-type layer of said four layers being exposed at said the other main surface and the other end N-type layer of said four layers being exposed at said one main surface, first electrode means disposed on said one main surface so as to be in ohmic contact with said one end P-type layer of said first semiconductor section and said other end N-type layer of said second semiconductor section, second electrode means disposed on said other main surface so as to be in ohmic contact with said the other end N-type layer of said first semiconductor section and said one end P-type layer of said second semiconductor section, first optical trigger means for applying a light signal to said side surface of said first semiconductor section, so as to trigger said first semiconductor section, second optical trigger means for applying a light signal to said side surface of said second semiconductor section, so as to trigger said second semiconductor section, said semiconductor substrate and said first and second electrode means being arranged so as to form means for blocking the passage of a light signal from said first optical trigger means to said second semiconductor section and the passage of a light signal from said second optical trigger means to said first semiconductor section.

* * * * *